United States Patent [19]
Kaneko

[11] Patent Number: 5,525,838
[45] Date of Patent: Jun. 11, 1996

[54] SEMICONDUCTOR DEVICE WITH FLOW PREVENTING MEMBER

[75] Inventor: Yasushi Kaneko, Sayama, Japan

[73] Assignee: Citizen Watch Co., Ltd., Tokyo, Japan

[21] Appl. No.: 347,352

[22] PCT Filed: Apr. 7, 1994

[86] PCT No.: PCT/JP94/00586

§ 371 Date: Nov. 30, 1994

§ 102(e) Date: Nov. 30, 1994

[87] PCT Pub. No.: WO94/24699

PCT Pub. Date: Oct. 27, 1994

[30] Foreign Application Priority Data

Apr. 8, 1993 [JP] Japan ................. 5-023515 U

[51] Int. Cl.⁶ .................................................. H01L 23/48
[52] U.S. Cl. ........................ 257/778; 257/779; 257/786
[58] Field of Search .................................. 257/778, 779, 257/781, 786, 783

[56] References Cited

FOREIGN PATENT DOCUMENTS 3824008  1/1990  Germany.
4-273464 9/1992  Japan.

Primary Examiner—William Mintel
Assistant Examiner—Roy Potter
Attorney, Agent, or Firm—Townsend and Townsend and Crew

[57] ABSTRACT

The present invention is to provide a semiconductor device having a connection structure for preventing a short circuit between connection electrodes, which is caused by a conductive adhesive or a solder, even in high-density connection with a connection pitch of 150 μm or less, thereby obtaining a high connection yield. The semiconductor device has a substrate having a plurality of connection electrodes (17), a semiconductor device (11) having a projecting electrode (15), a conductive adhesive (18) for connecting the connection electrodes and the projecting electrode, and a flow preventing member (22), provided between the connection electrodes of the substrate, for preventing a short circuit between the connection electrodes.

8 Claims, 3 Drawing Sheets

FIG. 1  *PRIOR ART*
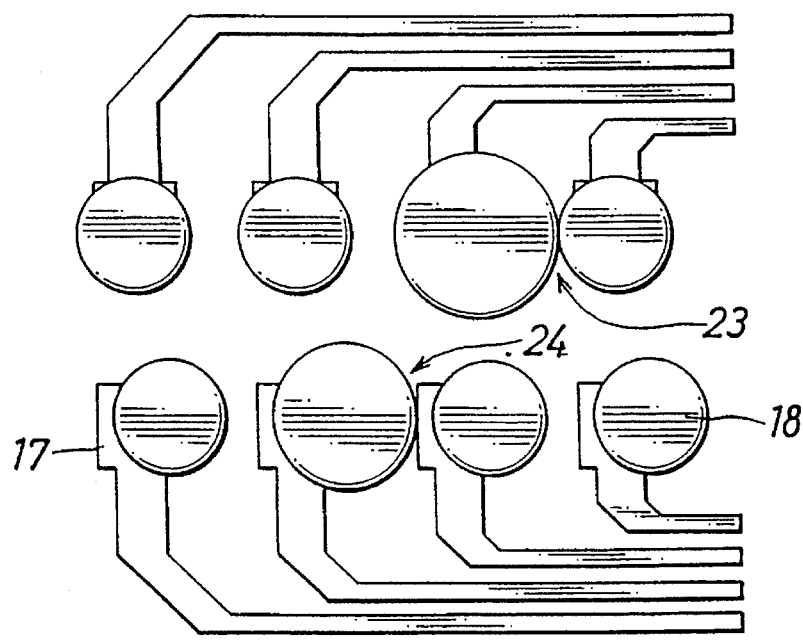
FIG. 2
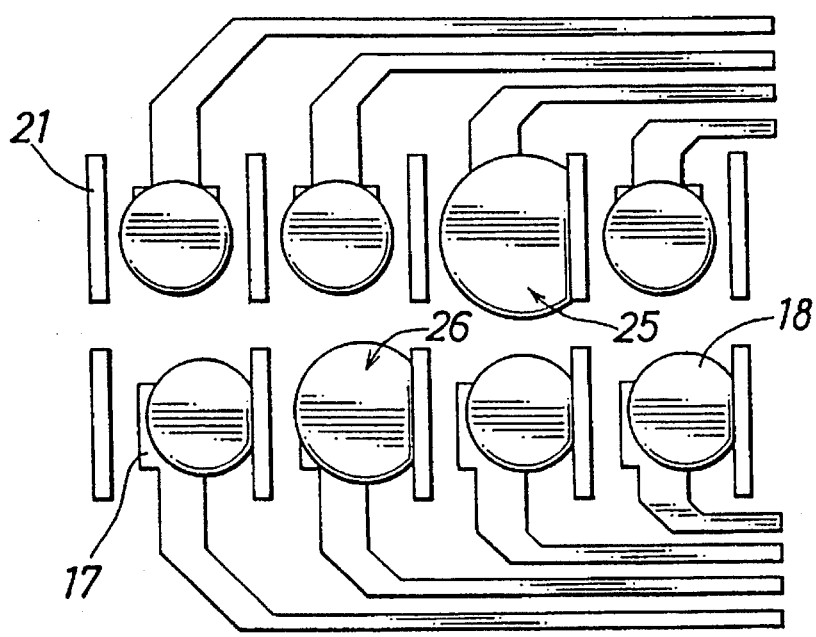

5,525,838

SEMICONDUCTOR DEVICE WITH FLOW PREVENTING MEMBER

TECHNICAL FIELD

The present invention relates to a connection structure between a projecting electrode provided to a semiconductor device and a substrate and is mainly used to mount a driving semiconductor device in a liquid crystal display unit.

BACKGROUND ART

As a means for mounting a semiconductor device in a liquid crystal display unit, a so-called chip-on-glass (to be referred to as COG hereinafter) method in which a semiconductor device is mounted in a substrate consisting of glass will be described with reference to FIGS. 4 and 5. FIG. 4 is a sectional view showing a projecting electrode provided to a semiconductor device. FIG. 5 is a sectional view showing a mounting structure in which the semiconductor device and a substrate are connected to each other by using the COG method.

As shown in FIG. 4, a protective film 13 is formed such that a connection pad 12 formed on the element formation surface of a semiconductor device 11 and consisting of aluminum is exposed. A common electrode film 14 is formed on the connection pad 12 to prevent adhesion to the connection pad 12 or diffusion. A projecting electrode 15 is formed using a metal such as copper or gold (Au) by a plating method or a vacuum evaporation method. The projecting electrode 15 is also formed on a semiconductor element formation region to improve the mounting density.

A method of connecting the semiconductor device 11 having the projecting electrode 15 formed thereon to a connection electrode 17 arranged on a substrate 16 will be described below with reference to FIG. 5.

As shown in FIG. 5, a conductive adhesive 18 obtained by mixing conductive particles 19 in an epoxy adhesive is coated at the distal end portion of the projecting electrode 15 of the semiconductor device 11 by a dip method or a printing method.

Thereafter, using a binocular microscope, alignment between the semiconductor device 11 and the substrate 16 is performed, thereby connecting the connection electrode 17 formed on the substrate 16 consisting of glass to the projecting electrode 15.

The connection electrode 17 is constituted by a transparent conductive film of indium tin oxide (to be referred to as ITO hereinafter) or the like.

A heat treatment is performed to harden the conductive adhesive 18 and evaporate the solvent of the conductive adhesive 18.

With this process, the conductive particles 19 and the projecting electrode 15, the conductive particles 19 and the adhesive electrode 17, and the conductive particles 19 are rendered conductive with each other, thereby obtaining satisfactory electrical connection.

In addition, by a tensile stress between the semiconductor device 11 and the substrate 16, which is generated by volume reduction of the conductive adhesive 18, an adhesion for stabilizing the connection is generated, and the electrical connection properties are improved.

Thereafter, a sealing resin 20 consisting of an organic material such as an epoxy material is poured into the gap between the semiconductor device 11 and the substrate 16, and a heat treatment is performed to harden the sealing resin 20.

A problem to be solved by the present invention will be described on the basis of the accompanying drawings. FIG. 1 is a plan view showing the connection electrodes 17 on the glass substrate and the conductive adhesives 18 after hardening when viewed from the upper side.

To increase the display density of a liquid crystal display unit, the pitch between the connection electrodes 17 in the right-and-left direction in FIG. 1 must be reduced. Conventionally, the pitch between the connection electrodes 17 is about 300 μm. However, the use of a pitch of 150 μm or 100 μm has been examined.

In accordance with a reduction in the pitch between the connection electrodes 17, the diameter of the projecting electrode of the semiconductor device is reduced, and the size of the conductive adhesive 18 formed on the projecting electrode is reduced accordingly.

However, when the conductive adhesive is to be formed on the projecting electrode by the printing method as described above, because of the influence of variations in height of the projecting electrode or variations in flatness of the semiconductor device or a printing apparatus, the formation amount of the conductive adhesive is locally increased. In this case, the size of the conductive adhesive is undesirably increased at some portions.

Therefore, when high-density mounting is to be performed, a short circuit between a conductive adhesive and another conductive adhesive, which is indicated by an arrow 23 in FIG. 1, or a short circuit between a conductive adhesive and a connection electrode, which is indicated by an arrow 24 in FIG. 1, is generated. This causes a decrease in connection yield and makes it difficult to increase the density of the connection electrodes 17.

To solve this problem, the present invention has as its object to provide a semiconductor device having a connection structure for preventing a short circuit between connection electrodes, which is caused by a conductive adhesive or a solder, even in high-density connection with a connection pitch of 150 μm or less, thereby obtaining a high connection yield.

SUMMARY OF INVENTION

In order to achieve the above object, a semiconductor device of the present invention adopts the following arrangement.

A semiconductor device of the present invention is characterized by comprising a substrate having a plurality of connection electrodes, a semiconductor device having a projecting electrode, a conductive adhesive for connecting the connection electrodes and the projecting electrode, and a flow preventing member provided between the connection electrodes of the substrate.

A semiconductor device of the present invention is characterized by comprising a substrate having a plurality of connection electrodes, a semiconductor device having a projecting electrode consisting of a solder, and a flow preventing member provided between the connection electrodes of the substrate.

According to the present invention, a member for preventing flow of a conductive adhesive or a solder is provided between the connection electrodes arranged on the substrate. With this arrangement, a short circuit between the connection electrodes, which is caused by the conductive adhesive or the solder is prevented, thereby obtaining a high connection yield between the projecting electrode provided to the semiconductor device and the connection electrodes arranged on the substrate.

If connection is to be performed using a conductive adhesive, a projecting electrode of gold or copper is formed on the semiconductor device. The connection electrode on the substrate is constituted by a transparent conductive film of ITO or the like.

If a solder is to be used, the projecting electrode of the semiconductor device is formed by solder plating. The connection electrode on the substrate is constituted by metal wiring of gold- or solder-plated copper.

As the flow preventing member, an organic or inorganic insulating material can be patterned and used. Alternatively, an equivalent effect can also be obtained by forming the flow preventing member with the same material as that of the connection electrode.

The conductive adhesive formed between the semiconductor device and the substrate is temporarily reduced in viscosity upon heat hardening, spreads outward in the interface with the substrate, and is hardened.

At this time, if a small projecting portion is present on the substrate, spreading of the conductive adhesive is suppressed. As the projecting portion, a flow preventing member having a thickness of 0.1 to several μm is arranged between the connection electrodes. With this arrangement, spreading of the conductive adhesive is suppressed, thereby preventing a short circuit between the connection electrodes.

In solder connection, melting and outward spreading of the solder is suppressed by the flow preventing member, thereby preventing a short circuit between the connection electrodes.

BRIEF DESCRIPTION OF DRAWINGS

FIG. 1 is a plan view showing the mounting structure of a semicondctor device in a prior art;

FIG. 2 is a plan view showing a mounting structure as the first example of a semiconductor device of the present invention;

BEST MODE OF CARRYING OUT THE INVENTION

Figure 3:
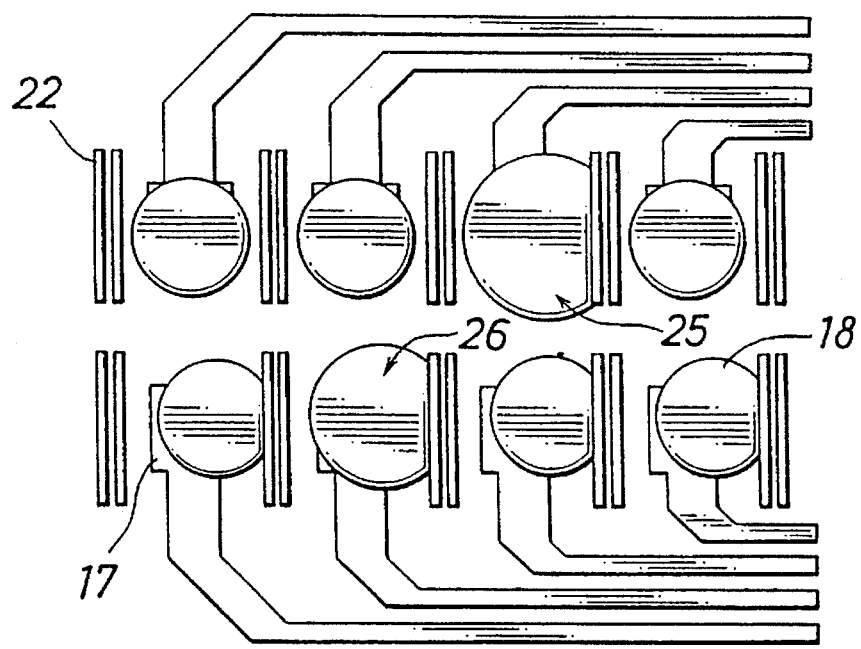
FIG. 3 is a plan view showing a mounting structure as the second example of the semiconductor device of the present invention.

Some preferred examples in a semiconductor device of the present invention will be described below with reference to the accompanying drawings.
Embodiment 1
FIG. 2 is a plan view showing a connection structure as the first example of a semiconductor device using a conductive adhesive in the first embodiment of the present invention, in which connection electrodes 17 on a substrate consisting of glass and conductive adhesives 18 after hardening when viewed from the upper side are shown.

As shown in FIG. 2, the connection electrode 17 is formed of ITO having a thickness of 0.25 μm. The pitch between the connection electrodes 17 in the right-and-left direction in FIG. 2 is 150 μm. The size of the connection electrode is 100 μm. square. The gap between the connection electrode 17 and the connection electrode 17 has a size of 50 μm.

A flow preventing member 21 having a thickness of 1 μm and a width of 10 μm is formed between the connection electrodes 17 on the substrate by using a photoresist which is a photosensitive organic insulating material.

In this embodiment, since the pitch between the connection electrodes 17 in the right-and-left direction in FIG. 2 is 150 μm, and the pitch in the up-and-down direction is 200 μm, the flow preventing members 21 are formed only along the right-and-left direction of the connection electrodes 17. However, if the pitch in the up-and-down direction is also small, it is preferable to form the flow preventing members 21 along the up-and-down and right-and-left directions of the connection electrodes 17.

Most conductive adhesives 18 are formed into a circle having a diameter of 100 to 120 μm, which is almost the same size as that of the connection electrode 17. At a portion indicated by an arrow 25, where the formation amount of the conductive adhesive is large, the size of the conductive adhesive 18 is increased.

However, spreading of the conductive adhesives 18 in the right direction in FIG. 2 is suppressed by the flow preventing members 21. For this reason, a short circuit between the conductive adhesive 18 and the adjacent connection electrode 17 can be prevented.

In addition, as indicated by an arrow 26 in FIG. 2, even when the semiconductor device and the substrate are misaligned with each other to cause a slight misalignment between the conductive adhesive 18 and the connection electrode 17, spreading of a portion indicated by the arrow 26, where the formation amount of the conductive adhesive 18 is slightly large, can be suppressed by the flow preventing member 21.

As a result, a short circuit between the adjacent connection electrodes 17 is prevented, and connection at high connection yield can be achieved even in a high-density arrangement in which the pitch between the connection electrodes 17 is about 150 μm.

Figure 4:
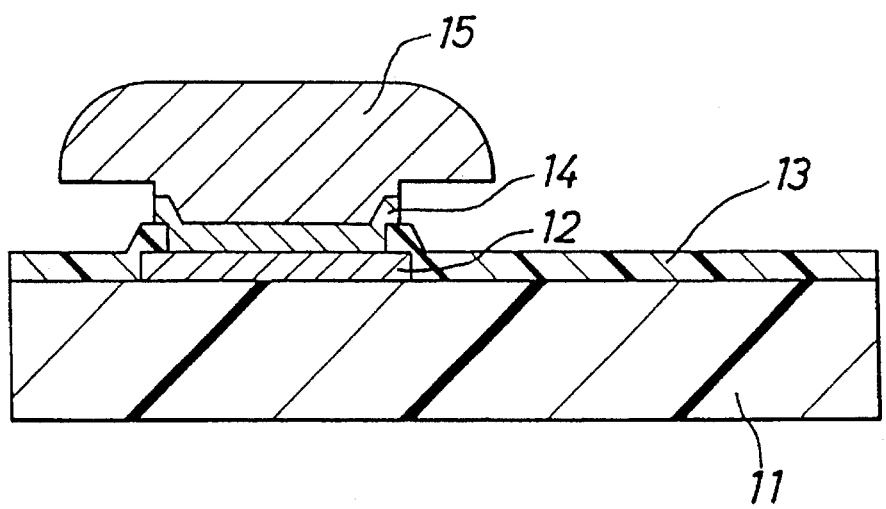
FIG. 4 is a sectional view showing a projecting electrode proved o the semiconductor device in the present invention and the prior art.

A manufacturing method of obtaining the structure of the semiconductor device according to Embodiment 1 shown in FIG. 2 will be described with reference to the accompanying drawing. FIG. 4 is a sectional view showing the semiconductor device having a projecting electrode used in the present invention.

As shown in FIG. 4, a protective film 13 is formed on the entire surface including a connection pad 12 formed on the element formation surface of a semiconductor device 11 and consisting of aluminum. As for the protective film 13, an inorganic insulating film such as a silicon oxide film containing phosphorus or a silicon nitride film, an organic insulating film such as a polyimide resin, or a multilayered structure thereof is generally used. The thickness of the protective film 13 is 1 to 5 μm.

Thereafter, by photolithography for performing exposure and development processes using a predetermined mask and etching, the protective film 13 is opened such that the connection pad 12 is exposed.

A metal multilayered film consisting of aluminum, chromium, copper, nickel, titanium, and the like is formed on the entire surface of the semiconductor device 11 as a common electrode film 14 having a thickness of 0.1 to 10 μm by a method such as sputtering or vacuum evaporation.

A plating resist (not shown) consisting of a photosensitive resin and having a thickness of 1 to 10 μm is coated on the entire surface of the common electrode film 14 formed on the semiconductor device 11. Thereafter, by photolithography for performing the exposure and development processes using a predetermined mask, a plating resist having an opening is formed on the connection pad 12.

A projecting electrode 15 consisting of a metal such as copper or gold (Au) is then formed by a plating method.

Thereafter, any unnecessary plating resist is removed, and any unnecessary common electrode film is removed using the projecting electrode 15 as a mask for etching, thereby leaving the common electrode film 14 at only the lower portion of the projecting electrode 15.

Figure 6:
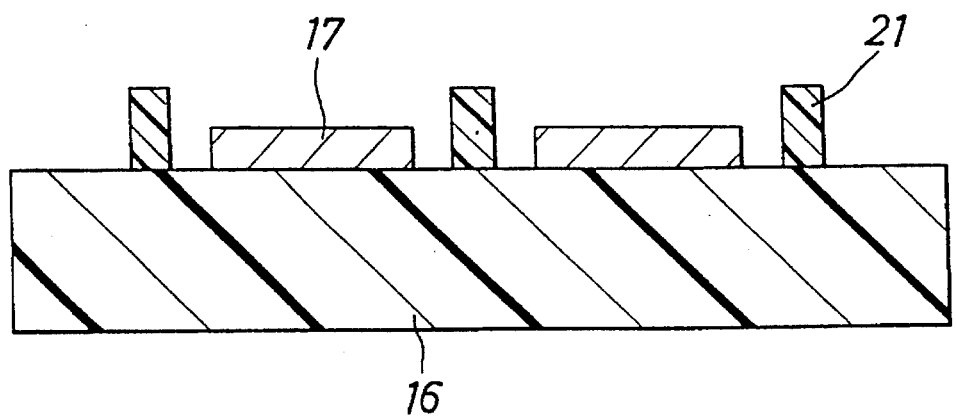
FIG. 6 is a sectional view showing connection electrodes and flow preventing members on the substrate in the present invention.

A method of forming the connection electrodes and the flow preventing members on the substrate used in the present invention will be described below with reference to FIG. 6. FIG. 6 is a sectional view showing the semiconductor device connection portion of a substrate 16.

As shown in FIG. 6, a transparent conductive film of ITO or the like having a thickness of 0.1 to 1 μm is formed on the entire connection surface of the substrate 16 consisting of glass by the sputtering method or the vacuum evaporation method.

A resist (not shown) consisting of a photosensitive resin and having a thickness of 1 to 10 μm is formed by a coating method. By photolithography for performing the exposure and development processes using a mask corresponding to the projecting electrode of the semiconductor device and etching of the transparent conductive film, the connection electrodes 17 are formed. Thereafter, any unnecessary resist is removed.

A positive-type photoresist consisting of an organic insulating material is formed on the entire surface as the flow preventing members 21 by a rotational coating method or a roll coater and temporarily dried at a temperature of 80° to 100° C.

Exposure and development processes are performed, and the resultant structure is calcined at a temperature of 150° to 200° C. for about one hour, thereby forming the flow preventing members 21 having a thickness of one to several μm.

The width of the flow preventing member 21 is adjusted to be preferably 5 to 20 μm in accordance with the pitch between the connection electrodes 17.

In Embodiment 1, as the material of the flow preventing member 21, a photoresist as an organic insulating material is used. However, a photosensitive acrylic resin, a photosensitive gelatin, or a photosensitive casein can also be used.

Although the number of manufacturing steps is increased, the flow preventing member 21 can be formed by forming an organic insulating material such as an epoxy resin or an acrylic resin or an inorganic insulating material such as silicon oxide or silicon nitride on the entire surface and thereafter using the photoetching process.

Figure 5:
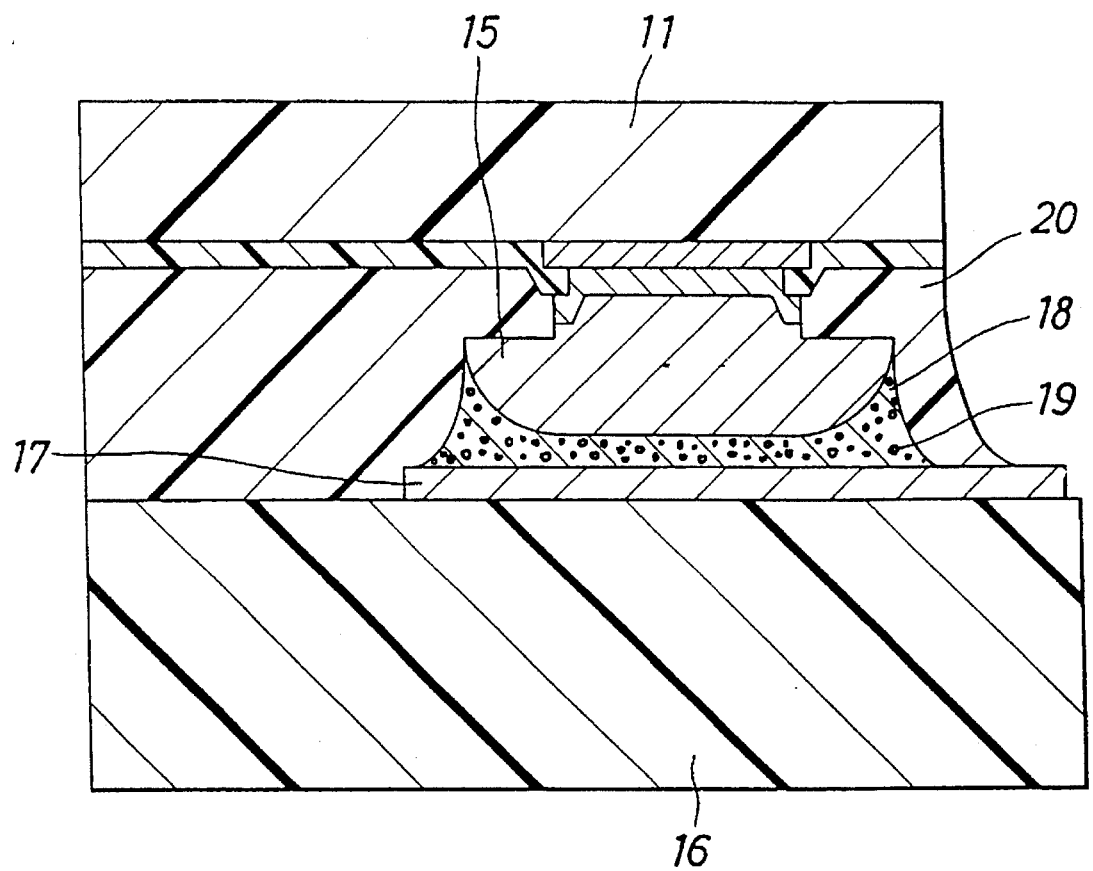
FIG. 5 is a sectional view showing the mounting structure of the semiconductor device and a substrate in the present invention and the prior art.

A method of connecting the semiconductor device to the substrate in the present invention will be described below with reference to FIG. 5. FIG. 5 is a sectional view showing a method of mounting the semiconductor device and the substrate.

As shown in FIG. 5, the conductive adhesive 18 is formed at the distal end portion of the projecting electrode 15 of the semiconductor device 11 by the dip method or the printing method.

Thereafter, using a binocular microscope, the connection electrode 17 arranged on the substrate 16 consisting of glass is aligned with the projecting electrode 15 provided to the semiconductor device 11.

The semiconductor device 11 is pressurized, and the conductive adhesive 18 is hardened at a temperature of 100° to 200° C. in a state wherein the semiconductor device 11 is temporarily connected to the substrate 16.

Finally, a sealing resin 20 consisting of an organic material such as an epoxy or rubber resin is poured into the gap between the semiconductor device 11 and the substrate 16 and hardened at a temperature of 100° to 150° C., thereby completing a high-density mounted semiconductor device.

Embodiment 2

FIG. 3 is a plan view showing a connection structure as the second example of a semiconductor device using a conductive adhesive in the second embodiment of the present invention, in which connection electrodes 17 on a substrate consisting of glass and conductive adhesives 18 after hardening when viewed from the upper side are shown.

As shown in FIG. 3, the connection electrode 17 is formed of ITO having a thickness of 0.25 μm. The pitch between the connection electrodes 17 in the right-and-left direction in FIG. 3 is 150 μm. The size of the connection electrode 17 is 100 μm square. The gap between the connection electrode 17 and the connection electrode 17 has a size of 50 μm.

A set of two flow preventing members 22 formed of ITO which is the same material as that of the connection electrode 17 is arranged between the connection electrodes 17.

As for the two flow preventing members 22, the width of one flow preventing member 22 is 5 μm, and the interval between the two flow preventing members 22 is 5 μm.

As in Embodiment 1 shown in FIG. 2, one flow preventing member may also be used. However, if the formation amount of all the conductive adhesives 18 is increased to increase the size of all the conductive adhesives 18 accordingly, the number of short circuits between the connection electrodes 17 increases because of the conductivity of ITO. For this reason, sets each consisting of two flow preventing members having a gap therebetween are arranged.

Therefore, if the conductive adhesives 18 spreads from both sides, spreading of the conductive adhesives 18 is stopped by the flow preventing members 22, thereby preventing a short circuit between the connection electrodes 17.

A method of manufacturing the substrate in Embodiment 2 will be described below with reference to FIG. 3.

As shown in FIG. 3, a transparent conductive film of ITO or the like is formed on the entire surface of the substrate consisting of glass by using the sputtering method or the vacuum evaporation method. Thereafter, sets each consisting of two flow preventing members 22 insulated from each other at the central portion and the connection electrodes 17 are formed by photoetching process.

In the formation process of the connection electrodes 17, the pattern of the flow preventing members 22 is formed on a photomask for forming the connection electrodes 17. With this process, sets each consisting of two flow preventing members 22 can be simultaneously formed using the transparent conductive film.

For this reason, the manufacturing steps remain the same as usual ones, and the manufacturing cost is not influenced at all.

Since the ITO used in Embodiment 2 is of a low-resistivity type, its thickness is about 0.25 μm. However, spreading suppressing hardening of the conductive adhesive 18 is confirmed. As for a portion indicated by an arrow 25, where the formation amount of the conductive adhesive 18 is large, spreading in the right direction is suppressed by the flow preventing member 22, thereby preventing a short circuit between the conductive adhesive 18 and the adjacent connection electrode 17.

In addition, even if the semiconductor device and the substrate are misaligned with each other to cause a slight misalignment between the conductive adhesive 18 and the connection electrode 17, spreading of the portion indicated by an arrow 26, where the formation amount of the conductive adhesive is large, is suppressed by the flow preventing member 22, thereby preventing a short circuit between the conductive adhesive and the adjacent connection electrode 17. With this arrangement, connection at high connection yield can be achieved even in high-density mounting in which the pitch between the connection electrodes 17 is 150 µm.

In Embodiment 2, the pitch between the connection electrodes 17 is 150 µm. However, when the size of the connection electrode 17 is 50 to 60 µm, and the size of the flow preventing member 22 is 5 to 10 µm, connection in high-density mounting with a pitch of 100 µm. can be achieved.

Also in medium-density mounting in which the pitch size between the connection electrodes 17 is 300 µm or more, a large effect of connection yield improvement can be obtained.

In the above-described Embodiment 1 and Embodiment 2, connection between the projecting electrode of the semiconductor device and the connection electrode arranged on the substrate consisting of glass is performed using a conductive adhesive. However, also when connection between the projecting electrode consisting of a solder provided to the semiconductor device and the connection electrode arranged on a printed board or a flexible printed board is performed by solder melting, the connection stability can be obtained by providing a flow preventing member for the solder.

In this case, the projecting electrode is formed on the connection pad on the semiconductor device by using solder plating.

The connection electrode on the substrate is preferably formed by plating gold or a solder on copper wiring. The flow preventing member of a solder is also preferably formed of copper which is the same material as that of the connection electrode, and is preferably a set of two flow preventing members having a gap therebetween at the central portion as in Embodiment 2.

Alternatively, the flow preventing member for the solder can be formed of a photosensitive organic insulating material used for insulating coating on the surface of a printed board or a flexible printed board.

As is apparent from the above description, in the connection structure of the semiconductor device according to the present invention, a short circuit between adjacent connection electrodes, which is caused by a conductive adhesive or solder, can be prevented. For this reason, high-density connection in which the pitch between connection electrodes is 150 µm or less can be achieved, and the connection yield can be improved. Conventionally, even when a conductive adhesive or solder is formed to overlap connection electrodes, a complete short circuit is not generated between adjacent connection electrodes because of a thin insulating film on the connection electrodes. For this reason, in a product which is not detected as a defective device and delivered as a non-defective device, a short circuit may be generated when the insulating film is broken during driving. In the connection structure of the semiconductor device according to the present invention, the conductive adhesive or solder does not overlap the connection electrodes. Therefore, an effect of improving long-term connection stability is provided.

I claim:

1. A semiconductor device comprising a substrates having a plurality of connection electrodes, a semiconductor device having a projecting electrode, a conductive adhesive for connecting said connection electrodes and said projecting electrode, and a flow preventing member which is conductive as a whole, consists of the same material as that of said connection electrodes and is provided between said connection electrodes of said substrate.

2. A semiconductor device according to claim 1, wherein each of said connection electrodes is formed by a transparent conductive film.

3. A semiconductor device according to claim 1, wherein said flow preventing member is a photosensitive organic insulating material selected from the group consisting of a photosensitive acrylic resin, a photosensitive gelatin, and a photosensitive casein.

4. A semiconductor device comprising a substrate having a plurality of connection electrodes, a semiconductor device having a projecting electrode, a conductive adhesive for connecting said connection electrodes and said projecting electrode, and a flow preventing member consisting of a photosensitive organic insulating material selected from the group consisting of a photosensitive acrylic resin, a photosensitive gelatin, and a photosensitive casein and provided between said connection electrodes of said substrate.

5. A semiconductor device according to claim 4, wherein one said flow preventing member is arranged between said connection electrodes.

6. A semiconductor device according to claim 4, wherein a set of two said flow preventing members is arranged between said connection electrodes.

7. A semiconductor device comprising a substrate having a plurality of connection electrodes, a semiconductor device having a projecting electrode, a conductive adhesive for connecting said connection electrodes and said projecting electrode, and a set of first and second flow preventing members consisting of the same material as that of said connection electrodes and arranged between said connection electrodes of said substrate.

8. A semiconductor device according to claim 7 wherein the first and second flow preventing members are spaced apart.

* * * * *